(12) United States Patent
Ting et al.

(10) Patent No.: US 11,551,587 B2
(45) Date of Patent: *Jan. 10, 2023

(54) ELECTRONIC DEVICE

(71) Applicant: InnoLux Corporation, Miao-Li County (TW)

(72) Inventors: Chin-Lung Ting, Miao-Li County (TW); Chung-Kuang Wei, Miao-Li County (TW); Li-Wei Mao, Miao-Li County (TW); Chi-Liang Chang, Miao-Li County (TW); Chia-Hui Lin, Miao-Li County (TW)

(73) Assignee: InnoLux Corporation, Miao-Li County (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/567,176

(22) Filed: Jan. 3, 2022

(65) Prior Publication Data

US 2022/0122492 A1    Apr. 21, 2022

Related U.S. Application Data

(60) Continuation of application No. 17/161,617, filed on Jan. 28, 2021, now Pat. No. 11,250,738, which is a division of application No. 16/362,676, filed on Mar. 24, 2019, now Pat. No. 10,957,226.

(60) Provisional application No. 62/660,222, filed on Apr. 19, 2018.

(30) Foreign Application Priority Data

Sep. 20, 2018  (CN) .......................... 201811103070.4

(51) Int. Cl.
*G09F 9/302* (2006.01)
*G09G 3/32* (2016.01)

(52) U.S. Cl.
CPC ............. *G09F 9/3026* (2013.01); *G09G 3/32* (2013.01); *G09G 2300/026* (2013.01)

(58) Field of Classification Search
CPC ................................. G09F 9/3026; G09G 3/32
See application file for complete search history.

(56) References Cited

U.S. PATENT DOCUMENTS

2008/0074029 A1* 3/2008 Suehiro ................... H01L 24/97
                                                        257/E33.059
2015/0003083 A1   1/2015 Uehara
2018/0043178 A1   2/2018 Iguchi

FOREIGN PATENT DOCUMENTS

JP       2012-160430 A      8/2012

* cited by examiner

*Primary Examiner* — Thomas M Sember
(74) *Attorney, Agent, or Firm* — Winston Hsu

(57) ABSTRACT

An electronic device is disclosed and includes a base substrate, a circuit layer, and a plurality of light-emitting elements. The base substrate has a plurality of through holes, the circuit layer is disposed on the base substrate, and the light-emitting elements are disposed on the first circuit layer. An absolute value of a difference between two adjacent spacings of the plurality of through holes of the base substrate is less than 0.5 times radius of curvature of the electronic device when the electronic device is bent.

6 Claims, 8 Drawing Sheets

ELECTRONIC DEVICE

CROSS REFERENCE TO RELATED APPLICATIONS

This application is a continuation application of U.S. application Ser. No. 17/161,617, filed on Jan. 28, 2021, which is a division of U.S. application Ser. No. 16/362,676, filed on Mar. 24, 2019, which claims the benefit of U.S. Provisional Application No. 62/660,222, filed on Apr. 19, 2018. The contents of these applications are incorporated herein by reference.

BACKGROUND OF THE DISCLOSURE

1. Field of the Disclosure

The present disclosure relates to an electronic device, and more particularly to a flexible electronic device.

2. Description of the Prior Art

With the advance of display technology, large-sized display apparatus are used in more and more places, such that more consumers can watch the same image at the same time. Since the size of the large-sized display apparatus is beyond the size of the display device that can be generally produced, in order to achieve large-sized display, the display apparatus is formed by jointing a plurality of display devices. Because the display apparatus is formed by the plural display devices, the manufacturing cost is relatively high, such that if one of the display devices is damaged, other undamaged display devices still need to be taken apart for repairing. Therefore, to repair the large-sized tiling display apparatus is not convenient.

SUMMARY OF THE DISCLOSURE

An embodiment of the present disclosure provides an electronic device including a base substrate, a circuit layer, and a plurality of light-emitting elements. The base substrate has a plurality of through holes, the circuit layer is disposed on the base substrate, and the light-emitting elements are disposed on the first circuit layer. An absolute value of a difference between two adjacent spacings of the plurality of through holes of the base substrate is less than 0.5 times radius of curvature of the electronic device when the electronic device is bent.

These and other objectives of the present disclosure will no doubt become obvious to those of ordinary skill in the art after reading the following detailed description of the embodiment that is illustrated in the various figures and drawings.

DETAILED DESCRIPTION

Figure 1:
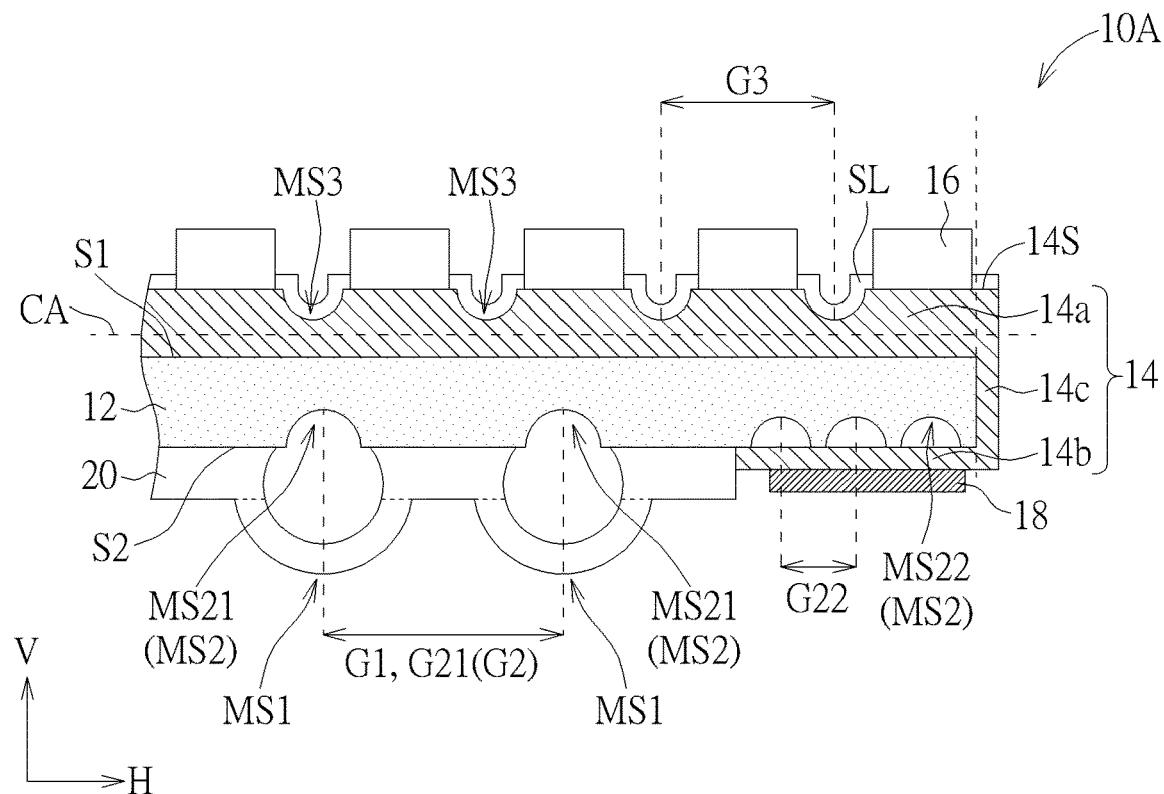
FIG. 1 illustrates a sectional view of an electronic device according to a first embodiment of the present disclosure.

The present disclosure may be understood by reference to the following detailed description, taken in conjunction with the drawings as described below. For purposes of illustrative clarity and being easily understood by the readers, various drawings of this disclosure show a portion of the display device, and certain elements in various drawings may not be drawn to scale. In addition, the number and dimension of each device shown in drawings are illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". It will be understood that when a component is referred to as being "coupled to" another component (or its variant), it can be directly connected to the another component, or be indirectly connected (for example electrically connected) to the another component through one or more intervening component. However, the use of like and/or corresponding numerals in the drawings of different embodiments does not suggest any correlation between different embodiments. In addition, in this specification, expressions such as "first material layer disposed above/on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the technical features in different embodiments described in the following can be replaced, recombined, or mixed with one another to constitute another embodiment without departing from the spirit of the present disclosure.

Refer to FIG. 1 which illustrates a sectional view of an electronic device according to a first embodiment of the present disclosure. The electronic device 10A comprises a base substrate 12, a first circuit layer 14 and a plurality of light-emitting elements 16. The base substrate 12 has a first surface S1 and a second surface S2 opposite to each other. The first circuit layer 14 is disposed on the first surface S1 and extends from the first surface S1 to the second surface S2 through an edge of the base substrate 12. The light-emitting elements 16 are disposed on a part of the first circuit layer 14 on the first surface S1. The first circuit layer 14 comprises abase layer (not shown in figures) and a circuit (not shown in figures) disposed on the base layer. In some embodiments, the base layer may comprise a polymer layer. For example, a material of the base substrate 12 and a material of the base layer may comprise polyimide (PI), polyethylene terephthalate (PET), polycarbonate (PC), poly (ethylene succinate) (PES), polybutylene terephthalate (PBT), polyethylene naphthalate (PEN), polyarylate (PAR), other suitable material, or a combination thereof, but the present disclosure is not limited thereto. Furthermore, in some embodiments, the light-emitting elements 16 comprises one of light-emitting diodes (LEDs), micro LEDs, mini LEDs, other display mediums, or a combination thereof, but the present disclosure is not limited thereto. The light-emitting elements 16 may for instance be LED packages or LED chips. Also, the light-emitting elements 16 may be single-sided (top surface) lighting type, four-sided (four side surfaces) lighting type or five-sided (top surface and four side surfaces) lighting type.

In one embodiment, the electronic device 10A may be a display device. Each light-emitting element 16 may serve as a display unit, such as a pixel or a sub-pixel, but the present disclosure is not limited thereto. In some embodiments, the electronic device 10A may be a sensing device or an antenna for example. In this embodiment, the first circuit layer 14 may comprise a first portion 14a, a second portion 14b and a third portion 14c. The first portion 14a may be a part of the first circuit layer 14 disposed on the first surface S1, the second portion 14b may be a part of the first circuit layer 14 disposed on the second surface S2, and the third portion 14c is a part of the first circuit layer 14 connecting the first portion 14a and the second portion 14b. Furthermore, the light-emitting elements 16 are disposed on the first portion 14a. In this embodiment, the electronic device 10A may further comprise a driving unit 18 for driving the light-emitting elements 16. The driving unit 18 is disposed on the part of the first circuit layer 14 bent onto the second surface S2 of the base substrate 12 (the second portion 14b), and the light-emitting elements 16 disposed on the first portion 14a of the first circuit layer 14 may be electrically connected to the driving unit 18 disposed on the second portion 14b of the first circuit layer 14. For example, the driving unit 18 may comprise a gate driving unit and a source driving unit. By means of bending and extending the first circuit layer 14 onto the second surface S2 of the base substrate 12, a part of the first circuit layer 14 with the driving unit 18 disposed thereon (for example the second portion 14b) may be disposed under the base substrate 12, such that a region of the electronic device 10A without displaying image may be reduced, and a gap between two adjacent electronic devices 10A may be also shrunk. In one embodiment, a spacing between two adjacent light-emitting elements 16 respectively in two adjacent electronic devices 10A may be close to or identical to a gap between two adjacent light-emitting elements 16 in the same one electronic device 10A, and thus, the gap between the adjacent electronic devices 10A is not easily seen by user. In some embodiments, the circuit of the first circuit layer 14 may comprise an array circuit. For example, the array circuit may comprise a plurality of scan lines, a plurality of data lines, a plurality of power lines, a plurality of drive transistors and a plurality of switch transistors, and one of the light-emitting elements 16 may be controlled by the corresponding scan line, the corresponding data line, the corresponding power line, the corresponding drive transistor and the corresponding switch transistor. The first circuit layer 14 may be formed by for example a thin-film transistor process. In some embodiments, the electronic device 10A may optionally further comprise a shielding layer SL disposed on the exposed first circuit layer 14 for shielding the circuit of the first circuit layer 14. In one embodiment, the shielding layer SL may be disposed on a part of the first portion 14a of the first circuit layer 14 where the light-emitting elements 16 are not disposed on. The shielding layer SL may be disposed on the exposed second portion 14b. A material of the shielding layer SL may comprise an insulating material, such as an organic material.

In this embodiment, the electronic device 10A may optionally comprise a second circuit layer 20 disposed on the second surface S2 of the base substrate 12 and electrically connected to the first circuit layer 14. Specifically, the second circuit layer 20 may be electrically connected to the driving unit 18 and the first circuit layer 14 through a conductive adhesive or a connector. The connector may for example a slot. By means of the second circuit layer 20, different electronic devices 10A may be electrically connected to each other, such that the plural electronic devices 10A may display a full image. In one embodiment, a composition of the second circuit layer 20 may be different from that of the first circuit layer 14. At least one of the second circuit layer 20, the second surface S2 of the base substrate 12 and a surface of the first circuit layer 14 facing the light-emitting elements 16 comprises at least one microstructure. The microstructure may be for example a recess, a bump or a through hole, and a sectional shape of the recess or the bump taken along a direction (such as a horizontal direction H) may be arc, triangle, rectangular, polygonal or other suitable shapes. In some embodiments, the microstructure may also comprise the recess with bump disposed therein (not shown in figures). By means of disposition of the microstructure, the electronic device 10A may have better flexibility when the electronic device 10A is bent and may not be damaged due to bending.

In this embodiment, the second circuit layer 20 may comprise at least one first microstructure MS1. Besides the recess or bump, the first microstructure MS1 may be for example a bent structure of the second circuit layer 20 protruding toward a direction away from the second surface S2, such that the first microstructure MS1 may not be in contact with the base substrate 12. For this reason, when the electronic device 10A is bent, the first microstructure MS1 may provide a stretchable space for the second circuit layer 20. In this embodiment, the number of the first microstructure MS1 may be plural, and the plural first microstructures MS1 are dispersed on the second surface S2 without the first circuit layer 14 disposed thereon. A spacing G1 may exist between center points of two adjacent first microstructures MS1. In this embodiment, the spacings G1 of the plural first microstructures MS1 may be close to or equal to each other, but not limited thereto. When the spacings G1 are close to each other, an absolute value of a difference between two spacings G1 may be less than 0.5 times radius of curvature of the electronic device 10A when the electronic device 10A is bent. In other embodiments, the spacings G1 of the first microstructures MS1 may be determined based on the positions of the electronic device 10A that the first microstructures MS1 correspond to. For example, a bending range of the electronic device 10A in a peripheral region adjacent to the edge may be greater than that of the electronic device 10A in a central region far away from the edge, so the spacing G1 of the first microstructures MS1 in the peripheral region of the electronic device 10A may be less than the spacing G1 of the microstructures MS1 in the central region of the electronic device 10A.

The second surface S2 of the base substrate 12 may optionally comprise at least one second microstructure MS2, the surface of the first circuit layer 14 facing the light-emitting elements 16 may optionally comprise at least one third microstructure MS3, and the first microstructure MS1 may correspond to at least one of the second microstructure MS2 and the third microstructure MS3. In this embodiment, one of the first microstructures MS1 may overlap at least one of the second microstructure MS2 and the third microstructure MS3 in a top-view direction V, for example a center point of the first microstructure MS1 may be close to a center point of the second microstructure MS2 in the top-view direction V. As an example, the second surface S2 of the base substrate 12 may comprise a plurality of second microstructures MS2, and the first portion 14a of the first circuit layer 14 may comprise a plurality of third microstructures MS3. A spacing G2 exists between the center points of two adjacent second microstructures MS2. The spacing G1 may be 0.9 to 1.1 times the spacing G2. An absolute value of a difference between two spacings G2 may be less than 0.5 times radius of curvature of the electronic device 10A when the electronic device 10A is bent, such that the radius of curvature of the bent electronic device 10A may be uniform. Another spacing G3 exists between center points of two adjacent third microstructures MS3. In this embodiment, the spacing G2 may be different from the spacing G3. Accordingly, when one of the second microstructures MS3 overlaps the corresponding first microstructure MS1, a part of one of the third microstructures MS3 may overlap the corresponding first microstructure MS1, and another part of the third microstructure MS3 does not overlap the corresponding first microstructure MS1. In some embodiments, the spacing G3 may be identical to the spacing G2.

In some embodiments, the second microstructures MS2 may comprise a plurality of first sub-microstructures MS21 and a plurality of second sub-microstructures MS22, and a spacing G21 between two adjacent first sub-microstructures MS21 may be different from a spacing G22 between two adjacent second sub-microstructures MS22. For example, the first sub-microstructures MS21 may be disposed in the central region of the electronic device 10A far away from the edge, the second sub-microstructures MS22 may be disposed in the peripheral region of the electronic device 10A adjacent to the edge, and the spacing G21 is greater than the spacing G22. Furthermore, a size of each first sub-microstructure MS21 may also be different from a size of each second sub-microstructure MS22. For example, a width of each first sub-microstructure MS21 in the horizontal direction H may be greater than a width of each second sub-microstructure MS22 in the horizontal direction H. The width of the microstructure may be the largest width of the microstructure in the horizontal direction H for instance. When the microstructure has an irregular shape, the width of the microstructure may be the largest length in the horizontal direction H formed by two points in the opening of the microstructure. Alternatively, a surface area of each first sub-microstructure MS21 may be greater than a surface area of each second sub-microstructure MS22. In some embodiments, the first microstructures MS1 and the third microstructures MS3 may also comprise the first sub-microstructures and the second sub-microstructures respectively, and the relative relations between the first sub-microstructures and the second sub-microstructures of the first sub-microstructures and the second sub-microstructures may be similar to that between the first sub-microstructures MS21 and the second sub-microstructures MS22 of the second microstructures MS2.

In this embodiment, the electronic device 10A may have a bending center axis CA disposed in the first circuit layer 14. For example, when the electronic device 10A is bent, compression or tension is not easily generated at the electronic device 10A of the bending center axis CA. Specifically, a distance between the bending center axis CA and a top surface of each light-emitting element 16 may be substantially equal to a distance between the bending center axis CA and a surface of the second circuit layer 20 far away from the base substrate 12, but not limited thereto. The farther away from the bending center axis CA the spacing is, the less the spacing may be. In other words, when a part of the electronic device 10A is farther away from the bending center axis CA, stress to the part of the electronic device 10A is greater when the electronic device 10A is bent. Accordingly, by means of reduction of the size of the spacing, the stress that the electronic device 10A receives may be reduced. For example, when a distance between the first microstructures MS1 and the bending center axis CA may be greater than a distance between the third microstructures MS3 and the bending center axis CA, the spacing G1 of the first microstructures MS1 may be less than the spacing G3 of the third microstructures MS3. In this embodiment, the spacing G1 of the first microstructures MS1 may be equal to the spacing G21 of the first sub-microstructure MS21, but not limited thereto. In some embodiments, the spacing G1 of the first microstructures MS1 may be less than the spacing G21 of the first sub-microstructures MS21.

Additionally, the size of the microstructure may be greater when the microstructure is farther away from the bending center axis CA. For example, since the distance between the first microstructures MS1 and the bending center axis CA is greater than the distance between the second microstructures MS2 and the bending center axis CA and the distance between the third microstructures MS3 and the bending center axis CA, the width of each first microstructure MS1 in the horizontal direction H parallel to the first surface S1 may be greater than the width of each second microstructure MS2 in the horizontal direction H and the width of each third microstructure MS3 in the horizontal direction H. In some embodiments, the distance between the second microstructures MS2 and the bending center axis CA may be greater than the distance between the third microstructures MS3 and the bending center axis CA, so the width of each second microstructure MS2 in the horizontal direction H may be greater than the width of each third microstructure MS3 in the horizontal direction H. Alternatively, in some embodiments, the surface area of each first microstructure MS1 may be greater than the surface area of each second microstructure MS2 and greater than the surface area of each third microstructure MS3. In some embodiments, the electronic device 10A may have the first microstructures MS1, the second microstructures MS2, the third microstructures MS3, or any two of them.

The electronic device is not limited by the aforementioned embodiment and may have other different variant embodiments or embodiments. To simplify the description, the identical components in each of the following variant embodiments or embodiments are marked with identical symbols. For making it easier to compare the difference between the first embodiment and the variant embodiment and the difference between the first embodiment and other embodiments, the following description will detail the dissimilarities among different variant embodiments or embodiments and the identical features will not be redundantly described.

Figure 2:
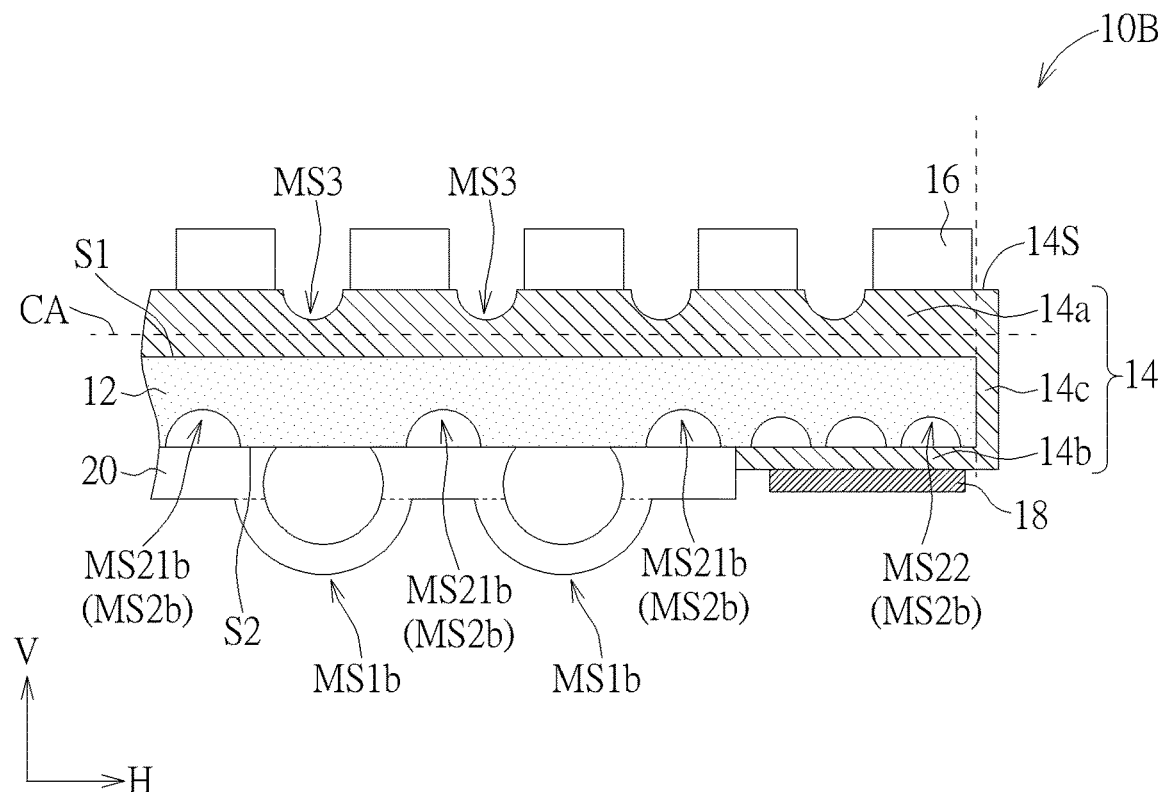
FIG. 2 illustrates a sectional view of an electronic device according to a variant embodiment of the first embodiment of the present disclosure.

Refer to FIG. 2 which illustrates a sectional view of an electronic device according to a variant embodiment of the first embodiment of the present disclosure. The electronic device 10B provided in this variant embodiment is different from the previous embodiment in that at least one of the first microstructures MS1b does not overlap the second microstructures MS2b in the top-view direction V. That is, the first microstructure MS1b and the second microstructures MS2b are staggered in the top-view direction V. For example, the first microstructures MS1b does not overlap the first sub-microstructure MS21b in the top-view direction V. In other embodiments, at least one of the first microstructures MS1b may overlap the corresponding second microstructure MS2b, and other first microstructures MS1b may not overlap the second microstructures MS2b. In some embodiments, at least one of the first microstructures MS1b may also not overlap the third microstructures MS3 in the top-view direction V. Alternatively, at least one of the first microstructures MS1b may overlap a part of the third microstructures MS3 in the top-view direction V, and other first microstructures MS1b may not overlap the third microstructures MS3. Similarly, the second microstructures MS2b and the third microstructures MS3 may have similar relative relation between them. In the present disclosure, the term "overlap" described herein refers to at least partial overlap between two components.

Figure 3:
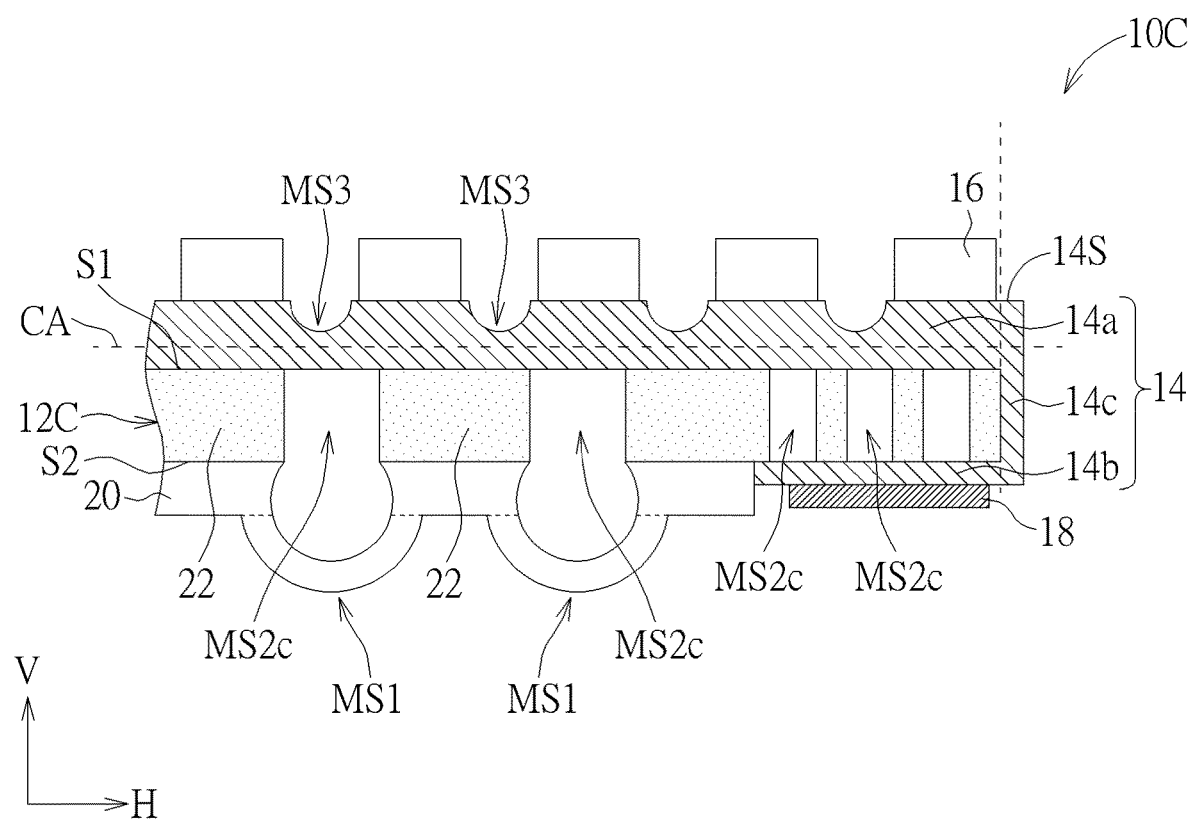
FIG. 3 illustrates a sectional view of an electronic device according to another variant embodiment of the first embodiment of the present disclosure.

Refer to FIG. 3 which illustrates a sectional view of an electronic device according to another variant embodiment of the first embodiment of the present disclosure. The electronic device 10C provided in this variant embodiment is different from the previous embodiment in that the base substrate 12C of this variant embodiment comprises a plurality of pillar or strip structures 22 that are different from the hemispherical structures shown in FIG. 2. In other embodiments, the base substrate 12C may also comprise at least one of a block-shaped structure and a mesh-shaped structure. For example, the base substrate 12C comprises the plurality of pillar structures 22 separated from each other, such that the flexibility of the base substrate 12C may be increased. For achieving supporting effect, the first surfaces S1 of the pillar structures 22 may be in contact with the first circuit layer 14, and the second surface S2 of the pillar structures 22 may be in contact with the second circuit layer 20. In this embodiment, each second microstructure MS2c may be a through hole penetrating through the base substrate 12C, and the through hole is disposed between two adjacent pillar structures 22. Furthermore, the second microstructures MS2c may be connected to each other and to from a mesh-shaped structure, a groove-shaped structure, other suitable structure or a combination thereof. In other embodiments, a sectional shape of each pillar structure 22 in the horizontal direction H may be for example rectangular, trapezoid, triangle, elliptical, semicircular, polygonal or other suitable shape. The area of the surfaces of the pillar structures 22 facing the light-emitting elements 16 may be greater than or less than the area of the surfaces of the pillar structures 22 facing the second circuit layer 20. For example, the disposition of triangular pillar structure 22 may be upright or inverted. In some embodiments, the pillar structure, block-shaped structure or strip structure may comprise solid structure or three-dimensional mesh-shaped structure. The three-dimensional mesh-shaped structure may have a plurality of pores. For example, the three-dimensional mesh-shaped structure comprises sponge. The pores may be filled with for example air or compressible material.

Figure 4:
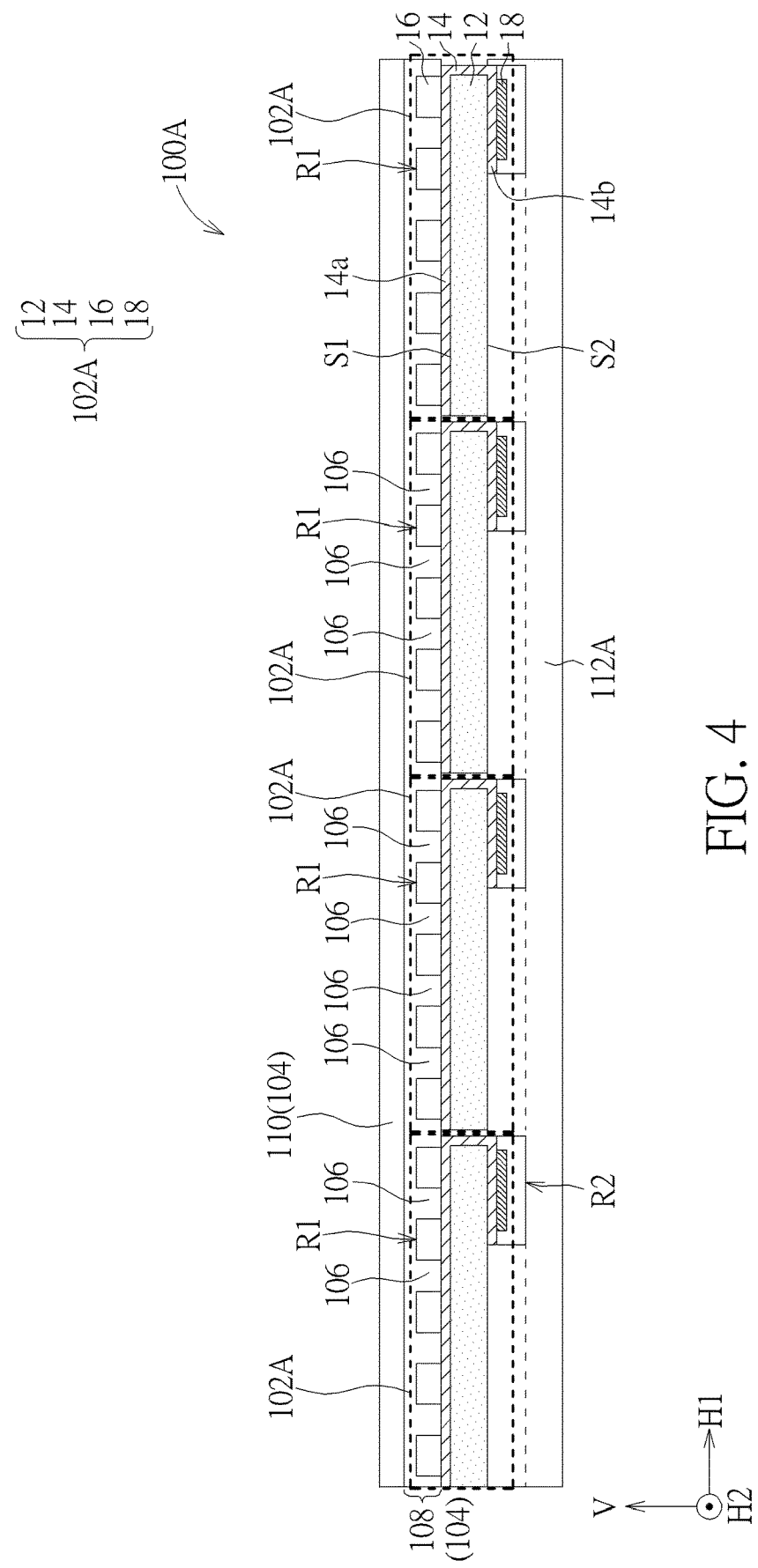
FIG. 4 and FIG. 5 respectively illustrate a sectional view and a top view of a tiling electronic apparatus according to a second embodiment of the present disclosure.
Figure 5:
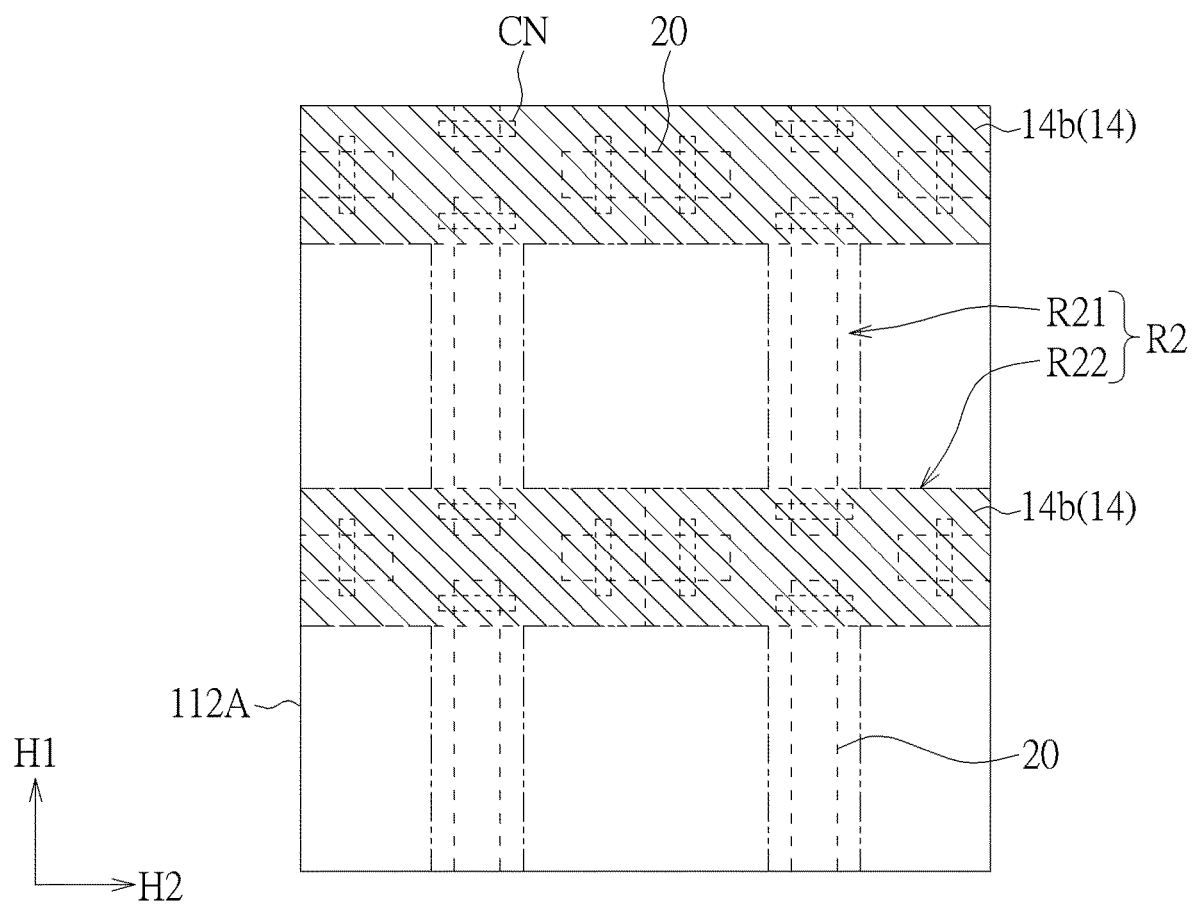

The electronic device of the above-mentioned embodiment may be applied to the tiling electronic apparatus, such as a rollable display screen that replaces the projection screen. Refer to FIG. 4 and FIG. 5 which respectively illustrate a sectional view and a top view of a tiling electronic apparatus according to a second embodiment of the present disclosure. The tiling electronic apparatus 100A provided by this embodiment comprises a plurality of electronic devices 102A and a first substrate 104, in which the electronic devices 102A may be combined into an assembly to display an image with large size. In one embodiment, the electronic devices 102A may not have the microstructures, but the present disclosure is not limited thereto. In some embodiments, the electronic devices 102A may adapt the electronic device of any one embodiment mentioned above.

In this embodiment, the first substrate 104 comprises a plurality of protrusion parts 106 arranged along a first horizontal direction H1, and one of the protrusion parts 106 may be engaged between two adjacent light-emitting elements 16 of each electronic device 102A. In some embodiments, the electronic devices 102A may be fixed on the first substrate 104 through the engagement between the protrusion parts 106 and the light-emitting elements. The electronic devices 102A may also be fixed to the first substrate 104 through other components. The first substrate 104 may comprise a plurality of first recesses R1, in which the first recesses R1 are formed between the protrusion parts 106, and one of the light-emitting elements 16 of each electronic device 102A may be disposed in the corresponding first recess R1. Specifically, the first substrate 104 may comprise an engaging layer 108, and a surface of the engaging layer 108 facing the electronic devices 102A has the protrusion parts 106. A width of each protrusion part 106 in the first horizontal direction H1 may be slightly greater than or equal to a gap between two adjacent the light-emitting elements 16. A width of each first recess R1 in the first horizontal direction H1 may be slightly less than or equal to a width of each light-emitting element 16 in the first horizontal direction H1, such that sidewalls of each protrusion part 106 may be engaged between the sidewalls of two adjacent light-emitting elements 16 through compression. In some embodiments, a material of the engaging layer 108 may comprise compressible material, such as silicone, polyurethane (PU), or other suitable material. Alternatively, the engaging layer 108 may comprise a hard material, and the hard material may have a plurality of pores spaced apart from the gaps between the protrusion parts 106; that is to say, the hard material may have three-dimensional mesh shape. For example, a material of the engaging layer 108 may comprise sponge. The pores may be filled with for example air or compressible material. By means of the compressibility of the protrusion parts 106, not only the protrusion parts 106 can be engaged between light-emitting elements 16, but also the light-emitting elements 16 can be prevented from damage during the engaging process. In some embodiments, the first substrate 104 may further comprise a base layer 110 serving as a base substrate for supporting the protrusion parts 104. A material of the base layer 110 may comprise polyethylene terephthalate (PET), but not limited thereto. It is noted that since the electronic devices 102A are independently engaged with the protrusion parts 106, single one of the electronic devices 102A may be taken apart from the protrusion parts 106 alone, thereby facilitating repair or exchange for the single one electronic device 102A. In one embodiment, the protrusion parts 106 may be disposed at intervals. In another embodiment, a plurality of light-emitting elements 16 may be disposed in one recess R.

In this embodiment, the first circuit layer 14 of each electronic device 102A may be bent onto the second surface S2 of the base substrate 12, such that the second portion 14b of the first circuit layer 14 may be fixed on the second surface S2 of the base substrate 12. In other embodiments, the second portion 14b of the first circuit layer 14 of each electronic device 102A may be extend to be under another electronic device 102A adjacent thereto and be adhered to the second surface S2 of the base substrate 12 adjacent thereto. In such situation, a boundary between the first portion 14a and the second portion 14b of the first circuit layer 14 may have alignment opening for facilitating assembling of two adjacent electronic devices 102A.

In this embodiment, the tiling electronic apparatus 100A may optionally comprise a second substrate 112A with a second recess R2, and a part of the second portion 14b of each first circuit layer 14 is engaged with the second recess R2. Refer to FIG. 5 as well, specifically, the second recess R2 may be mesh-shaped and comprise a plurality of first sub-recesses R21 extending along the first horizontal direction H1 and a plurality of second sub-recesses R22 extending along the second horizontal direction H2, in which the first sub-recess R21 and the second sub-recesses cross each other to form the mesh shape. For example, the first horizontal direction H1 may be substantially perpendicular to the second horizontal direction H2. An angle included between the first horizontal direction H1 and the second horizontal direction H2 may range from 60 degrees to 120 degrees. The second portion 14b of each first circuit layer 14 may be disposed in the corresponding second sub-recess R22. A width of the second portion 14b of each first circuit layer 14 in the first horizontal direction H1 may be slightly greater than or equal to a width of the corresponding second sub-recess R22 in the first horizontal direction H1, such that the second portion 14b can be engaged with the second sub-recess R22. In some embodiments, one of the second recesses R2 may be engaged with the corresponding driving unit 18; that is, the width of the second sub-recess R22 in the first horizontal direction H1 may be slightly less than or equal to a width of the corresponding driving unit 18 in the first horizontal direction H1. In some embodiments, a material of the second substrate 112A may comprise compressible material, such as silicone, PU, or other suitable material. Alternatively, a material of the second substrate 112A may comprise a hard material. The material of the second substrate 112A may have a plurality of pores and may have three-dimensional mesh shape. For example, the second substrate 112A may comprise sponge. The pores may be filled with for example air or compressible material.

Additionally, in this embodiment, each second circuit layer 20 may be disposed in the corresponding first sub-recess R21 or the corresponding second sub-recess R22 and may electrically connect the adjacent electronic devices 102A to each other. For example, one of the second circuit layers 20 may be electrically connected to one of the first circuit layers 14 through a connector CN. The connector CN may be for example a connecting pad or slot disposed on the first circuit layer 14. The second circuit layers 20 may extend along the first horizontal direction H1 or the second horizontal direction H2 and electrically connect the electronic devices 102A arranged along the first horizontal direction H1 or the electronic devices 102A arranged along the second horizontal direction H2. In some embodiments, the second circuit layers 20 may be integrated into the second substrate 112A; that is, the second substrate 112A may comprise connecting circuit for connecting the electronic devices 102A, thereby saving the second circuit layers 20.

Figure 6:
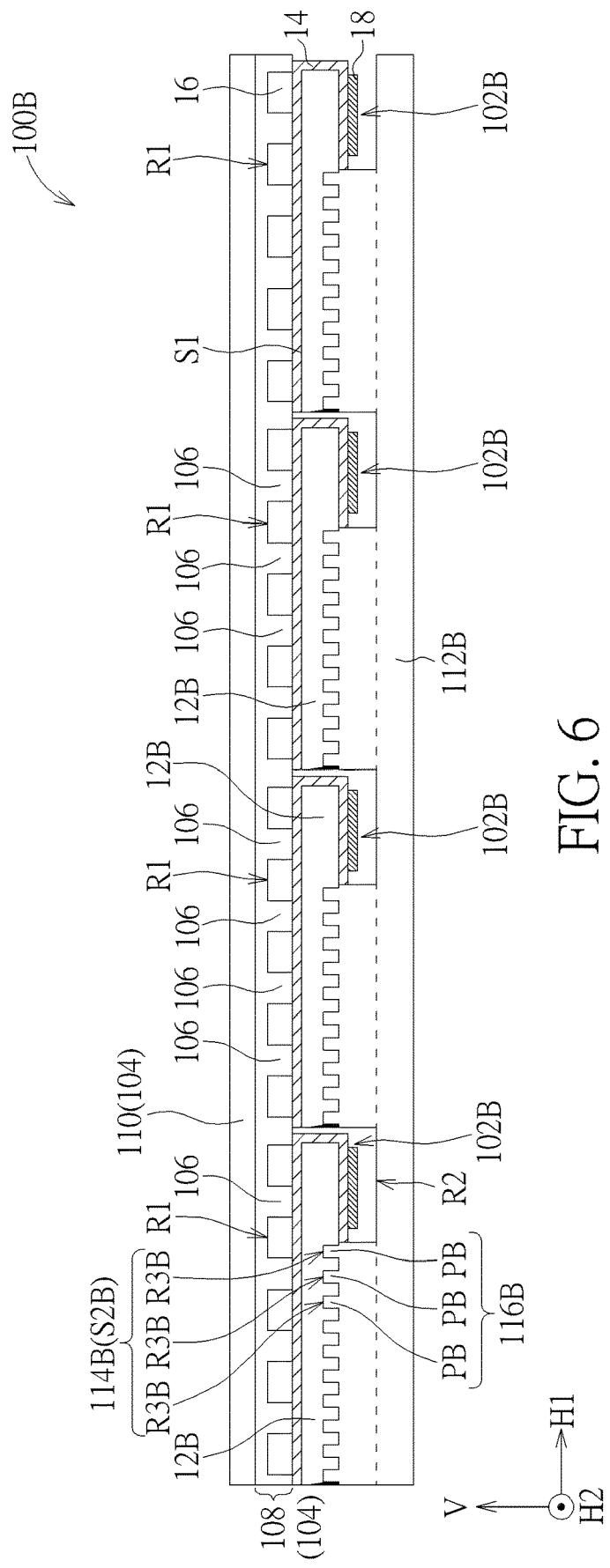
FIG. 6 illustrates a sectional view of a tiling electronic apparatus according to a variant embodiment of a second embodiment of the present disclosure.

Refer to FIG. 6 which illustrates a sectional view of a tiling electronic apparatus according to a variant embodiment of a second embodiment of the present disclosure. The tiling electronic apparatus 100B provided by this variant embodiment is different from the previous embodiment in that the second surface S2B of the base substrate 12B in each electronic device 102B has a first uneven portion 114B facing the second substrate 112B, the second substrate 112B has a plurality of second uneven portions 116B facing the base substrate 12B, and the first uneven portions 114B may be engaged with the respective second uneven portion 116B in this embodiment. For example, each first uneven portion 114B comprises a plurality of recesses R3B, each second uneven portion 116B comprises a plurality of protrusion parts PB, and the protrusion parts PB may be engaged with the respective recess R3B. In some embodiments, each first uneven portion 114B may also comprise the protrusion parts, and each second uneven portion 116B comprises the recesses, such that the protrusion parts are engaged with the respective recess. In some embodiments, the electronic device 102B may also adapt the electronic device of any one above-mentioned embodiment.

Figure 7:
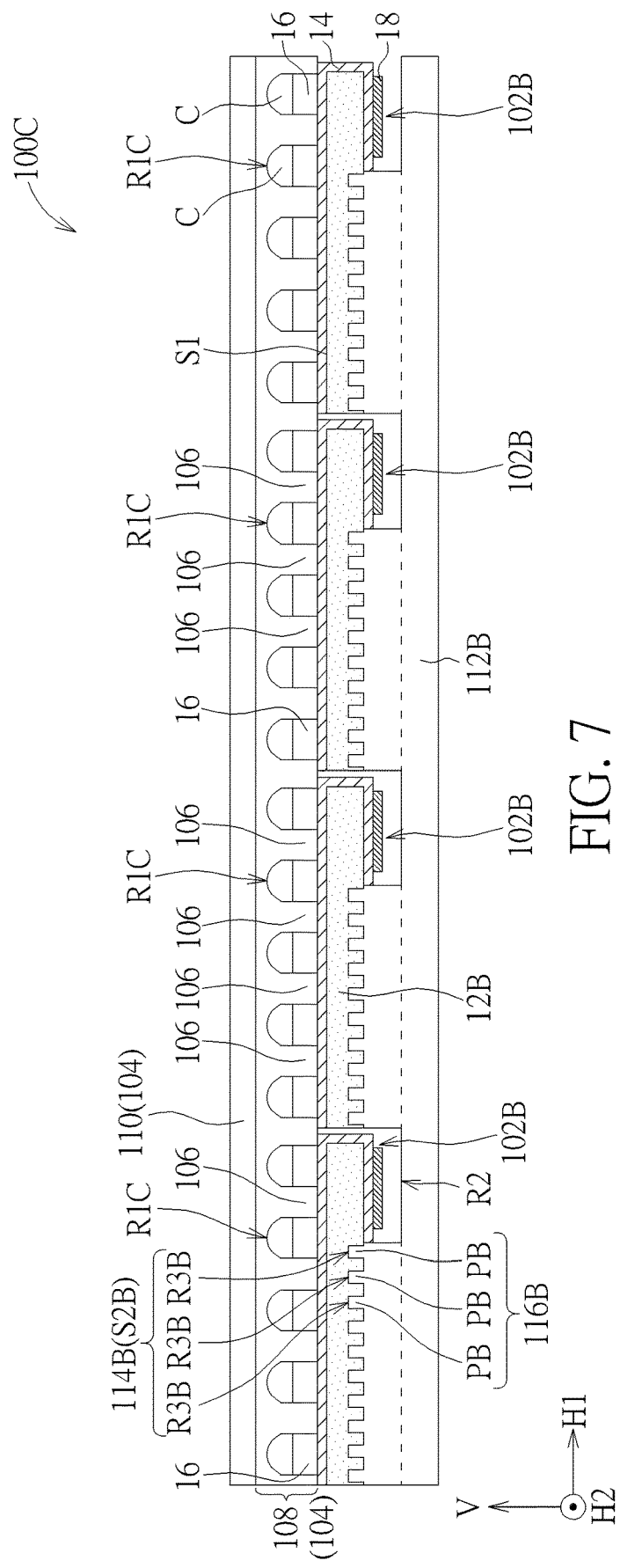
FIG. 7 illustrates a sectional view of a tiling electronic apparatus according to another variant embodiment of a second embodiment of the present disclosure.

Refer to FIG. 7 which illustrates a sectional view of a tiling electronic apparatus according to another variant embodiment of a second embodiment of the present disclosure. The tiling electronic apparatus 100C provided by this variant embodiment is different from the previous embodiment in that a bottom of one of the first recesses R1C of this variant embodiment is spaced apart from a top surface of the corresponding light-emitting element 16, such that a cavity is formed between the first recess R1C and the corresponding light-emitting element 16. For example, the cavity C may adjust a spatial distribution of an output light from the light-emitting element 16 and may serve as a lens. In other embodiments, the spatial distribution of the output light may be adjusted by filling the cavity C with optical material or altering a shape of the cavity C. In some embodiments, the bottom of the first recess R1C may be for example a concave arc shape, a convex arc shape, a planar shape, or a combination thereof.

Figure 8:
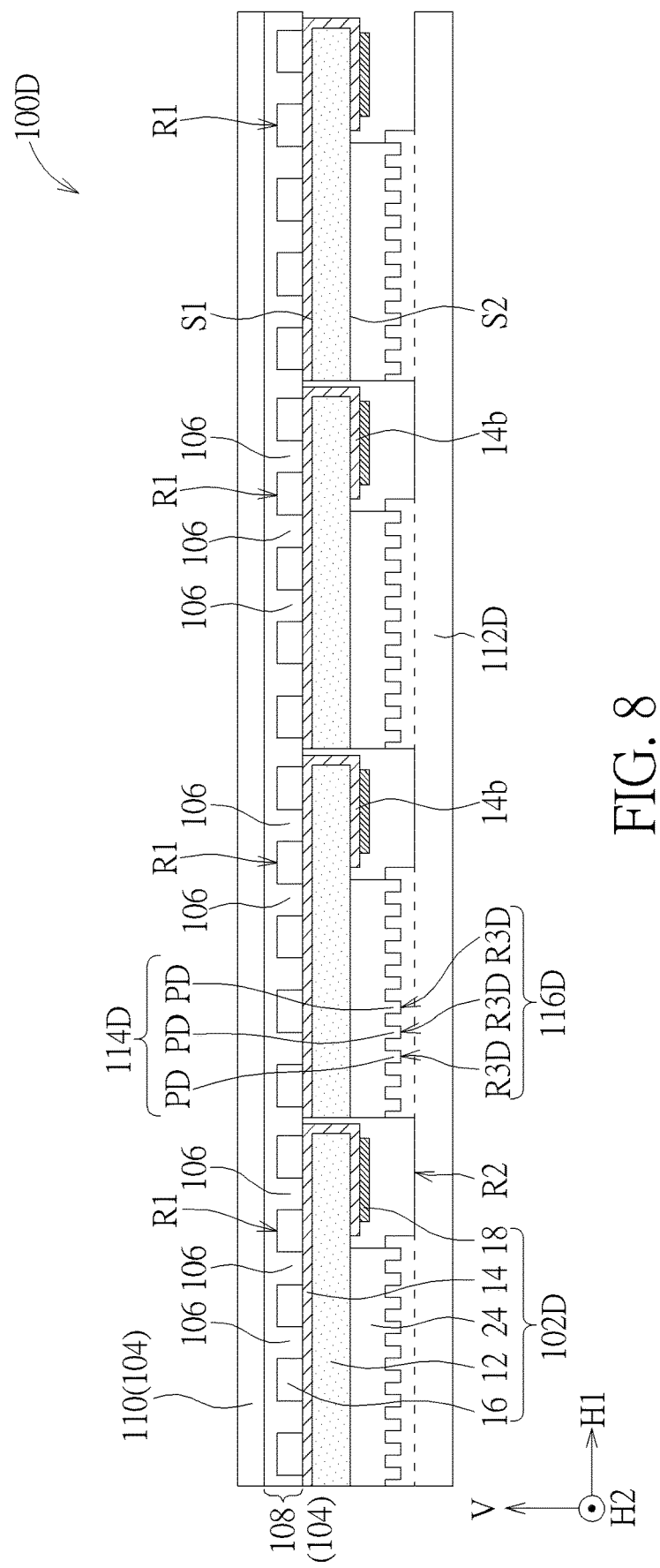
FIG. 8 illustrates a sectional view of a tiling electronic apparatus according to another variant embodiment of a second embodiment of the present disclosure.

Refer to FIG. 8 which illustrates a sectional view of a tiling electronic apparatus according to another variant embodiment of a second embodiment of the present disclosure. The tiling electronic apparatus 100D provided by this variant embodiment is different from the previous embodiment in that one of electronic devices 102D further comprises an engaging member 24 disposed on the second surface S2 of the base substrate 12, and the engaging member 24 may have a first uneven portion 114D facing the second substrate 112D. The second substrate 112D may have a plurality of second uneven portions 116D facing the engaging member 24. The first uneven portion 114D may be engaged with the corresponding second uneven portion 116D. For example, the first uneven portion 114D comprise a plurality of protrusion parts PD, each second uneven portion 116D comprises a plurality of recesses R3D, and each protrusion part PD may be engaged with the respective recess R3D. The protrusion parts PD of the engaging member 24 may have compressibility. In some embodiments, the first uneven portion 114D may also comprise the recesses, and each second uneven portion 116D comprises the protrusion parts, such that the protrusion parts are engaged with the respective recess. In some embodiment, the electronic device 102D may also adapt the electronic device of any one above-mentioned embodiment.

Figure 9:
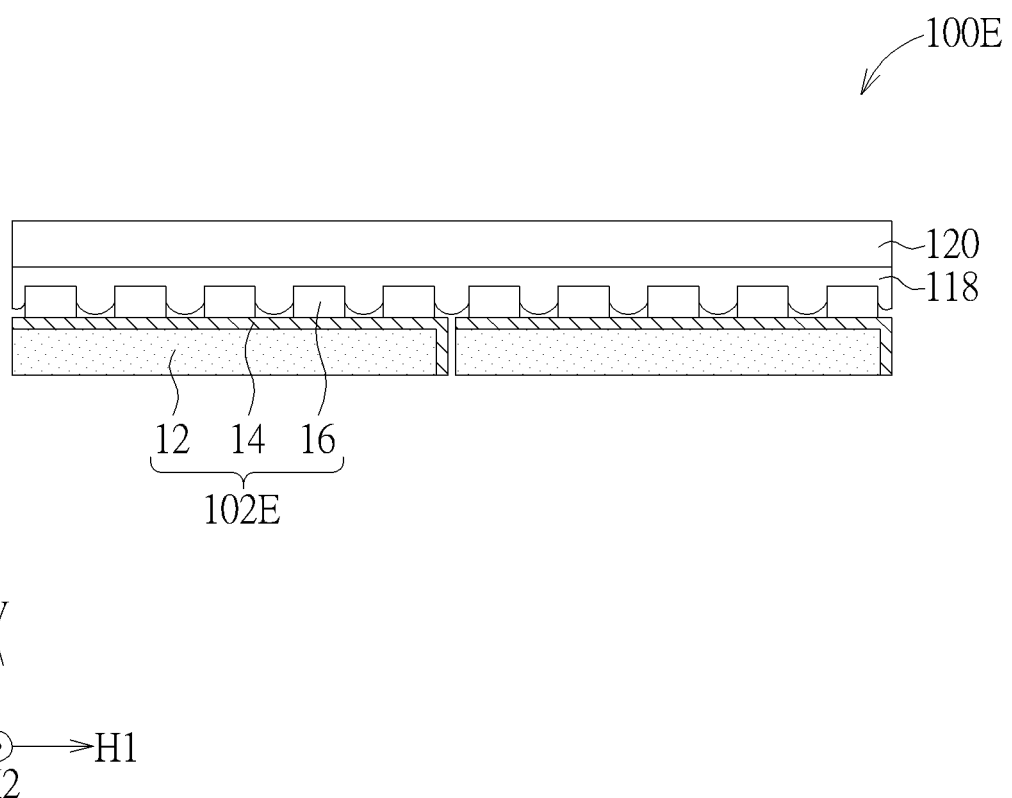
FIG. 9 illustrates a sectional view of a tiling electronic apparatus according to another variant embodiment of a second embodiment of the present disclosure.

Refer to FIG. 9 which illustrates a sectional view of a tiling electronic apparatus according to another variant embodiment of a second embodiment of the present disclosure. The tiling electronic apparatus 100E provided by this variant embodiment is different from the previous embodiment in that the electronic devices 102E of this variant embodiment may be fixed on the substrate 120 through an adhesive layer 118. In some embodiments, the tiling of the electronic devices 102E may adapt a method of engaging the protrusion parts of the substrate 120 with the light-emitting elements 16 and a method of adhering the electronic devices 102E to the substrate 120 through the adhesive layer 118. The adhesive layer 118 may be disposed between at least one of the protrusion parts of the substrate 120 and the first circuit layers 14. For example, the electronic devices 100E at the center of the tiling electronic apparatus 100E may adapt the engaging method, and the electronic devices 100E at the peripheral of the tiling electronic apparatus 100E may adapt the adhering method in case that the electronic device 102E is loosed off. It is noted that the adhesive layer 118 may not fill up the gaps between the light-emitting elements 16, and voids may be generated between the adhesive layer 118 and the first circuit layers 14, such that the light from the light-emitting element 16 may be diffused through the voids, thereby widening the emitting angle and increasing the viewing angle of the tiling electronic apparatus 100E. In some embodiment, the electronic device 102E may also adapt the electronic device of any one above-mentioned embodiment.

As mentioned above, in the tiling electronic apparatus of the present disclosure, since the electronic devices are independently engaged with the protrusion parts of the first substrate, single one electronic device may be taken apart from the protrusion parts alone, thereby facilitating repair or exchange for the single one electronic device. Furthermore, in the electronic device of the present disclosure, at least one of the second circuit layer, the second surface of the base substrate and the surface of the first circuit layer facing the light-emitting elements comprises at least one microstructure, such that the electronic device may have better flexibility when the electronic device is bent and may not be damaged due to bending.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
   a base substrate, having a plurality of through holes;
   a first circuit layer, disposed on the base substrate; and
   a plurality of light-emitting elements, disposed on the first circuit layer;
   wherein an absolute value of a difference between two adjacent spacings of the plurality of through holes of the base substrate is less than 0.5 times radius of curvature of the electronic device when the electronic device is bent.

2. The electronic device as claimed in claim 1, wherein the first circuit layer comprises:
   a first portion, disposed on a first surface of the base substrate;
   a second portion, disposed on a second surface of the base substrate opposite to the first surface; and
   a third portion, connecting the first portion and the second portion,
   wherein the plurality of light-emitting elements are disposed on the first portion, and the third portion overlaps a side surface of the base substrate along a direction perpendicular to a top view direction of the electronic device.

3. The electronic device as claimed in claim 2, further comprising an insulating layer disposed between adjacent two of the plurality of light-emitting elements, wherein the insulating layer overlaps at least one of the plurality of through holes.

4. The electronic device as claimed in claim 2, further comprising an insulating layer disposed between adjacent two of the plurality of light-emitting elements, wherein the insulating layer overlaps the second portion of the first circuit layer.

5. The electronic device as claimed in claim 1, further comprising an insulating layer disposed between adjacent two of the plurality of light-emitting elements.

6. The electronic device as claimed in claim 5, wherein the insulating layer overlaps at least one of the plurality of through holes.

\* \* \* \* \*